(12) United States Patent
Gao

(10) Patent No.: US 10,905,031 B1
(45) Date of Patent: Jan. 26, 2021

(54) UNIVERSAL COOLING BASEBOARD MODULE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 16/729,182

(22) Filed: Dec. 27, 2019

(51) Int. Cl.
  *H05K 7/20* (2006.01)
  *G06F 1/20* (2006.01)
(52) U.S. Cl.
  CPC .......... *H05K 7/20781* (2013.01); *G06F 1/20* (2013.01); *H05K 7/20254* (2013.01); *H05K 7/20272* (2013.01); *H05K 7/20836* (2013.01)
(58) Field of Classification Search
  None
  See application file for complete search history.

(56) References Cited

U.S. PATENT DOCUMENTS

| 8,027,162 | B2* | 9/2011 | Campbell | ............ | H05K 7/2079 |
| | | | | | 361/699 |
| 10,645,847 | B2* | 5/2020 | Edwards | ............ | H05K 7/20809 |
| 2009/0161312 | A1* | 6/2009 | Spearing | ............ | H05K 7/20772 |
| | | | | | 361/679.47 |
| 2015/0043165 | A1* | 2/2015 | Best | .......................... | G06F 1/20 |
| | | | | | 361/699 |
| 2017/0295667 | A1* | 10/2017 | Cader | .................... | H05K 7/2079 |
| 2019/0320548 | A1* | 10/2019 | Gao | ........................ | H05K 7/208 |
| 2020/0288601 | A1* | 9/2020 | Gao | .................... | H05K 7/20236 |

* cited by examiner

*Primary Examiner* — Courtney L Smith
(74) *Attorney, Agent, or Firm* — Womble Bond Dickinson (US) LLP

(57) ABSTRACT

In one embodiment, a cooling device for providing liquid cooling to an electronics circuit board includes an upper module having a cooling plate forming an upper surface to receive an external circuit board having one or more electronic devices deposited thereon, the upper module having a first liquid distribution channel embedded therein to extract heat from the electronic devices of the circuit board through the cooling plate using a cooling liquid flowing in the first liquid distribution channel. The cooling device further includes a lower module having a second liquid distribution channel embedded therein to receive the cooling liquid from an external cooling liquid source, and the cooling device includes a plurality of tube channels positioned between the upper module and the lower module to receive the cooling liquid from the lower module and to supply the cooling liquid upwardly to the upper module.

20 Claims, 6 Drawing Sheets

UNIVERSAL COOLING BASEBOARD MODULE

FIELD OF THE DISCLOSURE

Embodiments of the present invention relate generally to data centers. More particularly, embodiments of the invention relate a universal cooling baseboard module.

BACKGROUND

Thermal management of a data center that includes several active electronic racks is critical to ensure proper performance of servers and other IT equipment operating in the racks. Without proper thermal management the thermal environment within the racks may exceed operational thresholds, resulting in operational consequences (e.g., servers failing, etc.). One way to manage the thermal environment is the use of cooling air to cool the IT equipment. A majority of existing data centers are air cooled. Recently, data centers have been deploying more high-power density electronic racks, where more high density chips are packaged closer together to provide more processing power. Cooling these high-density racks by maintaining a proper thermal environment may be an issue with existing cooling systems.

Liquid cooling is becoming a feasible solution for high power density electronics with the increasing of power density of these electronics. In some of the cases, the air cooling may not be a feasible solution. First of all, when the power density of electronics is high, it exceeds the limitation of most of the air cooling devices or system. A continuous air cooling design will sacrifice a significant cost (both initial capital cost and operation cost) and the reliability also becomes a challenge. Secondly, in some of the latest electronics packages, the entire motherboard as well as the electronics are packaged in an enclosed system. This means the electronics may not be able to access any air source. Therefore, air cooling cannot be used in the system. Thirdly, the edge computing devices may be used in outside environments. Even though the cooling air is available for these electronics, the conditions of the air including temperature, humidity, quality may not feasible for operating these devices, or the cooling system.

One of the main disadvantages of liquid cooling over air cooling is the complexity of the design. The liquid cooling introduces several additional components into the server including the manifold, hoses, connectors and cooing devices. These components not only increase the design complexity, but also increases the corresponding cost and decreases the reliability. In many recent server design, multiple high power density processors are packaged on the motherboard. A liquid cooling solution design becomes more challenge for a system with multiple liquid cooled high power density processors.

For cloud service providers, the types of server hardware to be deployed in their data centers may be in significant different, such that some of them maybe customized severs, such as some of them maybe Scorpio servers or OCP servers, or some of them maybe standard servers. The thermal mechanical and electrical design of these servers are in different forms.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
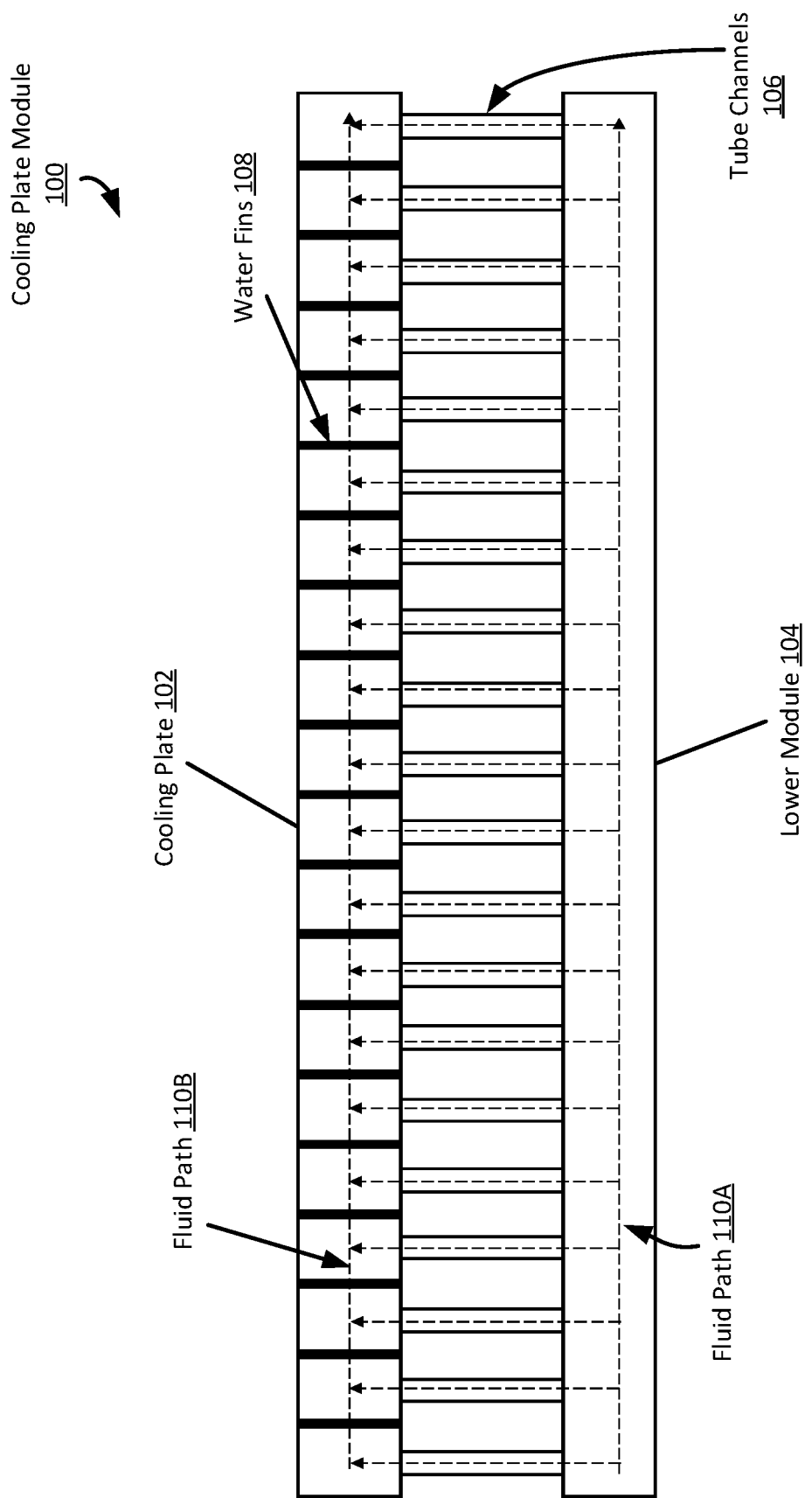
FIG. 1 is a cross-sectional side view of a universal cooling baseboard module according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide a universal cooling baseboard design. The cooling baseboard is to be used for server liquid cooling assembling and packaging. The cooling baseboard exchanges cooling liquid from an external source through multiple ports. The internal structure of the cooling baseboard includes multiple fluid channels for distributing and spreading the fluid over the entire cooling surface of the baseboard. The cooling baseboard also includes functions for fluid distribution or liquid loop extension using the internal design and additional parts. Multiple fluid sub-ports are designed on the baseboard for distributing fluid to external cooling devices.

The internal channel design of the cooling baseboard and the liquid supply and return ensure that the cooling liquid from the external source goes into the cooling baseboard and is transported to the external cooling devices. Internal fluid path structure of the cooling baseboard ensures fluid distribution and efficient heat transfer from the heat source to the cooling medium (cooling liquid). The current invention is proposed to eliminate the components needed when implementing a liquid cooling solution on a server. The cooling baseboard eliminates many of the components needed when implementing a liquid cooling solution and is compatible with different rack configurations and rack and facility level fluid architectures. The cooling baseboard design also provides for additional flexibility since the design can be customized based on different liquid design on the motherboard. The invention is proposed to solve the installation difficulties and complexity of a liquid cooling module over a server by its design. The solution can be used for supporting different liquid cooling devices or their cooling loops, such as, multiple cold plates in a single loop in series or multiple cold plates in several parallel loops.

According to one embodiment, a cooling device for providing liquid cooling to an electronics circuit board includes an upper module having a cooling plate forming an upper surface to receive an external circuit board having one or more electronic devices deposited thereon. The upper module includes a first liquid distribution channel embedded therein to extract heat from the electronic devices of the circuit board through the cooling plate using a cooling liquid flowing in the first liquid distribution channel. A lower module includes a second liquid distribution channel embedded therein to receive the cooling liquid from an external cooling liquid source. A number of tube channels are positioned between the upper module and the lower module to receive the cooling liquid from the lower module and to supply the cooling liquid upwardly to the upper module.

In one embodiment, the cooling device includes an expansion module coupled to the lower module. The expansion module includes a liquid manifold with one or more expansion port connections to provide liquid distribution to additional liquid cooling devices. In one embodiment, the expansion module is detachably coupled to the lower module via one or more connecting ports. In one embodiment, the cooling device includes an additional cooling device coupled to one or more expansion ports of the liquid manifold of the expansion module. The additional cooling device is positioned on one or more electronic components on a top surface of the circuit board.

In one embodiment, the cooling plate includes a number of water fins providing additional contact area between the cooling liquid and the cooling plate to increase conduction heat transfer. In one embodiment, the tube channels are positioned to allow air to flow between the cooling plate and the lower module.

In one embodiment, an inlet port to receive cooling liquid from an external source; and an outlet port to return the cooling liquid carrying the heat extracted from the circuit board back to the external source. In one embodiment, a first thermal pad is positioned between the cooling plate and the bottom surface of the circuit board. The thermal pad is heat conductive.

FIG. 1 shows a detailed fluid structure of a cooling plate module design of a cooling baseboard module according to one embodiment. The cooling plate module includes a lower module/channel and upper channel. There are multiple tube channels connecting the lower channel and upper channel. Therefore, the lower channel, the tube channel and upper channel form the fluid paths within the cooling plate module of the cooling baseboard module. Within the upper module, a number of fins (depicted in FIG. 2) are assembled for cooling surface extension. It can be seen as shown in FIG. 1 that the fluid enters the cooling baseboard first, then enters the upper channel after pathing the lower channel and the tube channels.

The design is to maximize the contacting area of the water and the cooling plate. This improves the conductive heat transfer of the motherboard and the cooling plate as well as the heat transfer between the water and the cooling plate. The tube channel is used as a structure for more even fluid distribution within the upper module. It is used as a liquid to air cooling structure for different cooling applications as well.

In one embodiment, referring to FIG. 1, the cooling plate module includes a cooling plate 102, a lower module 104, and a number of tube channels 106 connecting the cooling plate 102 and lower module 104. The lower module 104 may receive a cooling liquid from an external cooling liquid source. The cooling liquid then flows along fluid path 110A of the lower module and upward through the tube channels 106 to the cooling plate 102. The cooling liquid then flows along fluid path 110B of cooling plate 102, extracting heat from a circuit board, motherboard, or other electronic device in contact with the cooling plate 102. The cooling liquid is then returned to the external cooling source. Additionally, as further described below with respect to FIGS. 3 and 4, the cooling liquid may also be provided by the cooling plate module to and from one or more expansion modules used to provide cooling liquid to additional cooling devices (such as cold plates, or server coolers, etc.).

The tube channels 106 may be micro-channels or micro-tubing to carry the cooling liquid from the lower module 104 to the cooling plate 102. The tube channels 106 can be spaced apart enough to allow air to flow between them. Thus, air passing in between the lower module 104 and the cooling plate 102 can be cooled through contact with the tube channels 106 carrying the cooling liquid. The cooled air may then be recirculated and used to air cool electronics within the same enclosure as the cooling plate module 100.

The cooling plate 102 further includes a number of water fins 108. The water fins 108 increase the amount of heat transferred from the cooling plate 102 to the cooling liquid flowing in fluid path 110B. As further described with respect to FIG. 2, the water fins 108 may be spaced throughout the cooling plate 102 to optimize a heat transfer area design of the cooling fluid with the water fins 108. I should be noted that the fluid path 110A-B depicted in FIG. 1 is representative and that other fluid paths may be used according to use cases.

Figure 2:
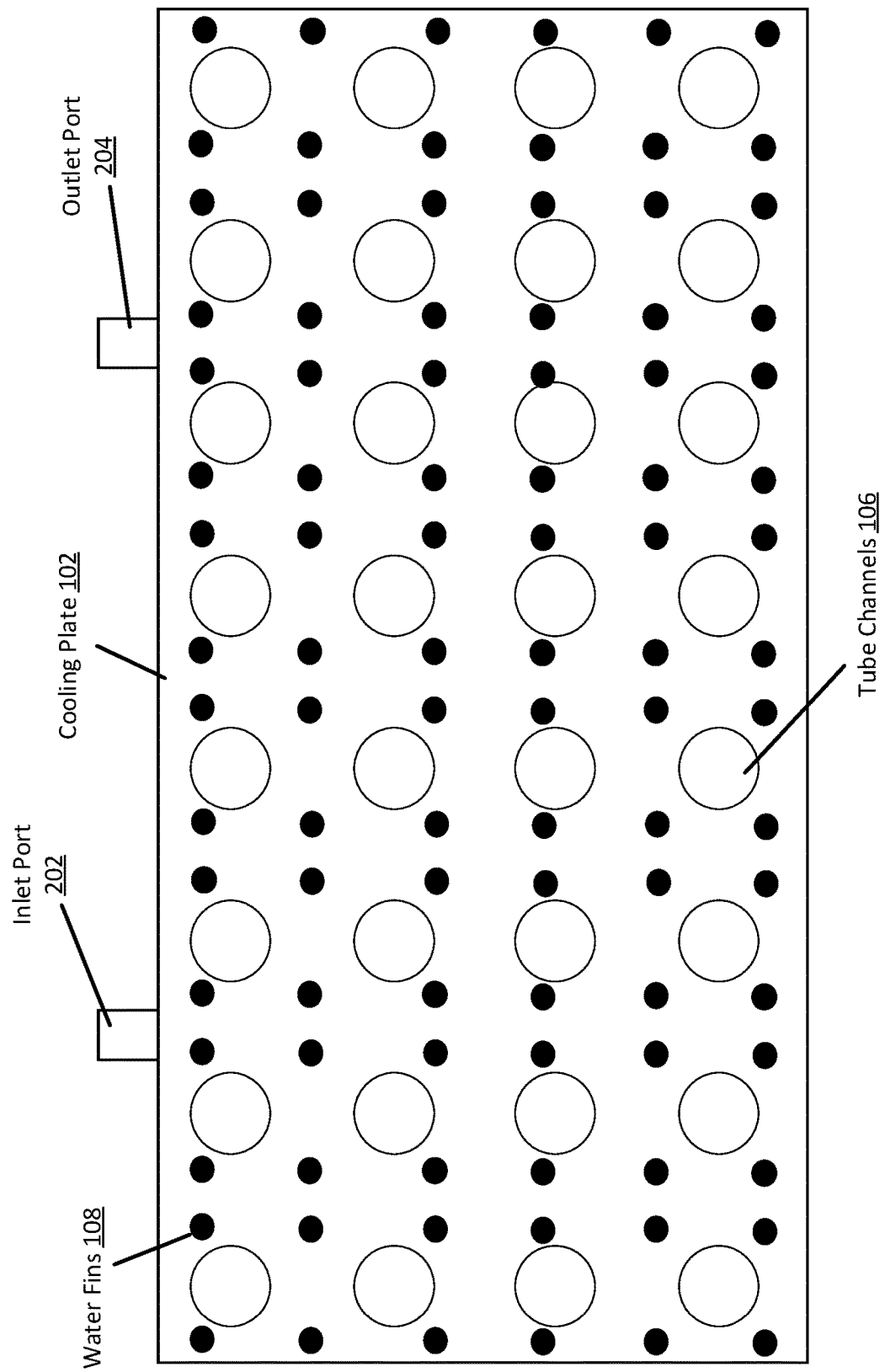
FIG. 2 is a cross-sectional top view of an upper module of a universal cooling baseboard module according to one embodiment.

FIG. 2 shows a top view of the internal structural design of the cooling plate module according to one embodiment. It can be seen that the upper channel is connected to the tube channels and that water fins are assembled within the upper channel. It needs to be mentioned that more detailed internal fluid structural design should be based on multiple experimental testing and engineering design cycle to for a final product, based on actual use cases.

In one embodiment, referring to FIG. 2, the cooling plate module includes the cooling plate 102, tube channels 106, and water fins 108, as depicted in FIG. 1. The cooling plate module further includes an inlet port 202 and an outlet port 204. The inlet port 202 receives a cooling liquid from a source external to the cooling plate module and provides the cooling liquid to a lower module (e.g., lower module 104 of FIG. 1). The cooling liquid flows from the lower module upward into the cooling plate 102 through tube channels 106. The tube channels 106 are spaced apart from one another to provide cooling fluid distribution throughout the cooling plate 102. The cooling liquid can flow throughout the entire cooling plate 102 during which heat is extracted through the cooling plate 102 to the cooling liquid.

Water fins 108 are distributed throughout the cooling plate 102. The water fins 108 may be pin-like structures that span from the top of the inside of cooling plate 102 to the bottom of the inside of the cooling plate 102. Heat that is extracted from electronics in contact with the surface of the cooling plate 102 is extracted from the surface to the cooling liquid. The heat is also transferred down through the water fins 108 as well. The heat transferred to the water fins 108 is then extracted to the cooling liquid flowing through the cooling plate 102 that contacts the water fins 108. Accordingly, the water fins 108 provide additional heat transfer area from the cooling plate 102 to the cooling liquid. It should be noted that the water fins 108 can vary in structure and are not restricted to the pin-like structure depicted in FIG. 2.

Figure 3:
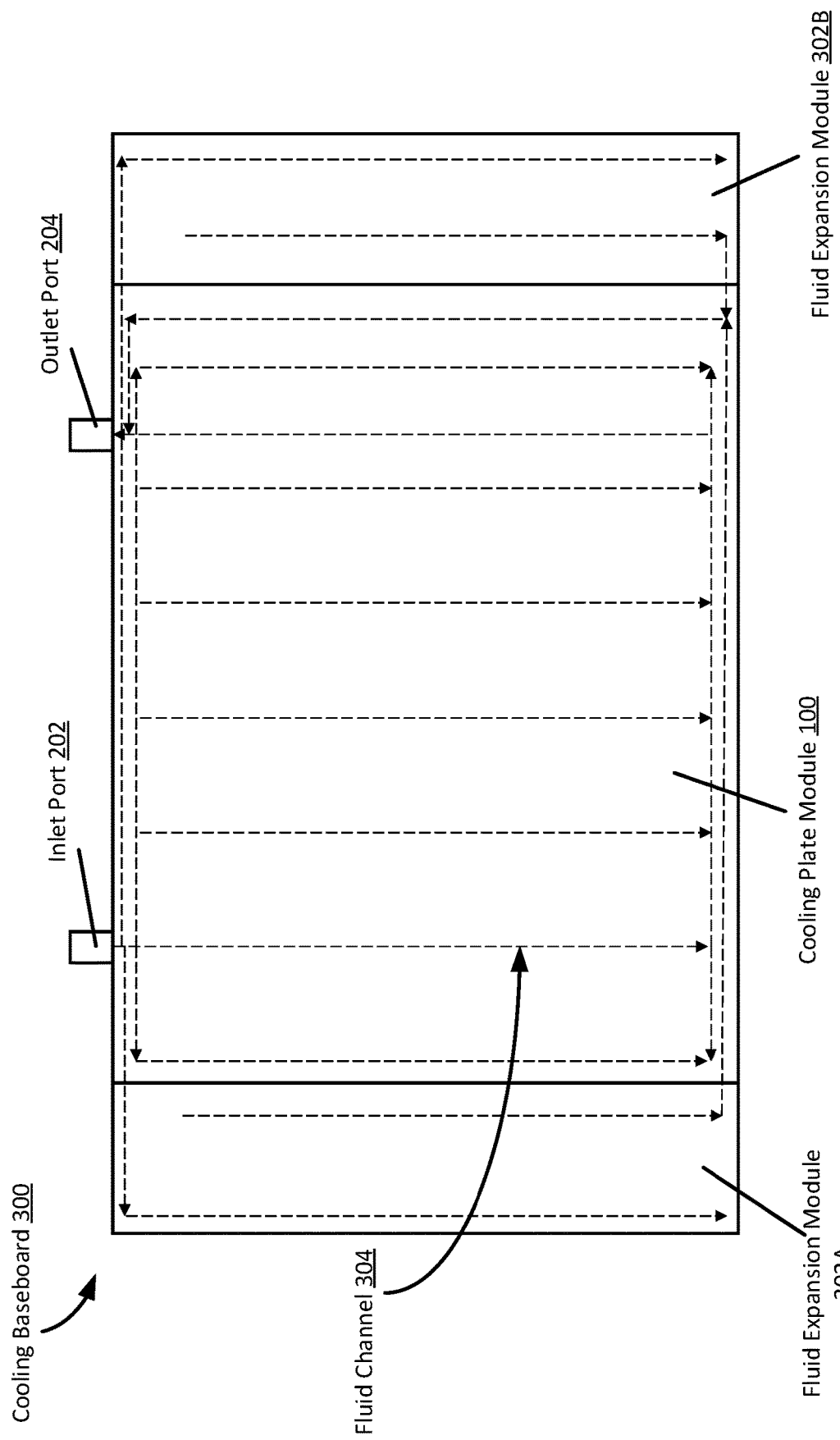
FIG. 3 is a top view of a universal cooling baseboard module according to one embodiment.

FIG. 3 shows the top view of a simplified schematic representation of the cooling module according to one embodiment. The main part of the cooling module consists of a cooling plate module. The cooling plate module will be used as the bottom base where the server motherboard will be attached on the top of it. The sides of the cooling module are designed as a fluid expansion module. This module can be also understood as a fluid distribution module. There will be not be any motherboard attached over the top of these modules. These modules are used for extending fluid supply and return to additional devices or other component level liquid cooling devices. The fluid inlet and outlet are assembled on the cooling module. These ports are used for connecting with external cooling sources. It needs to be mentioned that the numbers of the ports can vary in actual design cases based on different use cases. The ports can be dripless quick disconnect. The ports can also be blind-mating quick disconnects.

Fluid channel structural design is also shown in FIG. 3. It can be seen that the fluid enters the cooling module and is distributed to multiple modules, including the cooling plate module as well as the expansion module in parallel manner. Here in the current design, a parallel manner is drawn which maybe a more efficient method. However, fluid arrangement in series can be also used. The fluid is evenly distributed over the entire volume off the cooling plate. The supply and return fluid channel are included in both of the fluid expansion modules. Once a cooling loop is assembled on the server, its loop supply and return ports will be connected to these expansion modules through pre-defined fluid connectors. It needs to be mentioned that a cooling loop can be connected to the fluid supply port of one fluid expansion module and the return connected to a fluid return port of another fluid expansion. This means that the internal fluid channel enables the multiple fluid expansion modules as one single unit. This will significantly improve its compatibility with different server liquid cooling loops, as well as implementing liquid cooling loops on different electronics layout on a motherboard. For example, the cold plates are connected in parallel in one loop and some of the cold plate are connected in series in one loop.

In one embodiment, referring to FIG. 3, the cooling baseboard 300 includes the cooling plate module 100 of FIG. 1. The cooling plate module 100 includes an inlet port 202 and an outlet port 204. Attached to the cooling plate module 100 on either side are fluid expansion modules 302A-B. Cooling plate module 100 is designed to attach an electronic device or system, such as a circuit board or motherboard, to a cooling plate surface of the cooling plate module 100. However, the device is not to cover the fluid expansion modules 302A-B. The cooling plate module 100 may extract heat from the circuit board attached to the surface of the cooling plate module 100 using a cooling liquid flowing through a cooling plate along fluid channels 304 (e.g., cooling plate 102 of FIGS. 1 and 2). The cooling plate module 100 receives the cooling liquid from an external cooling liquid source through the inlet port 202.

The fluid expansion modules 302A-B may be permanently attached to the cooling plate module 100, as depicted, or may be detachable. The fluid expansion modules 302A-B may include one or more fluid expansion ports for providing a cooling liquid to additional cooling loops and cooling devices. The fluid expansion modules 302A-B can receive the cooling liquid from the cooling plate module 100 and provide the cooling liquid to additional cooling loops. In one example, a cooling loop can be attached to both fluid expansion modules, such that one end of the loop is attached to the supply of one fluid expansion module 302A and the other end of the loop is attached to the return of the other fluid expansion module 302B. In another example, both ends of a cooling loop are attached to the supply and return of the same fluid expansion module. Once the cooling liquid traverses the fluid expansion modules 302A-B and any additional cooling loops attached to the fluid expansion modules 302A-B, the cooling liquid is returned to the cooling plate module 100. The cooling liquid is then returned to the external liquid cooling source from the cooling plate module 100 through the outlet port 204.

Figure 4:
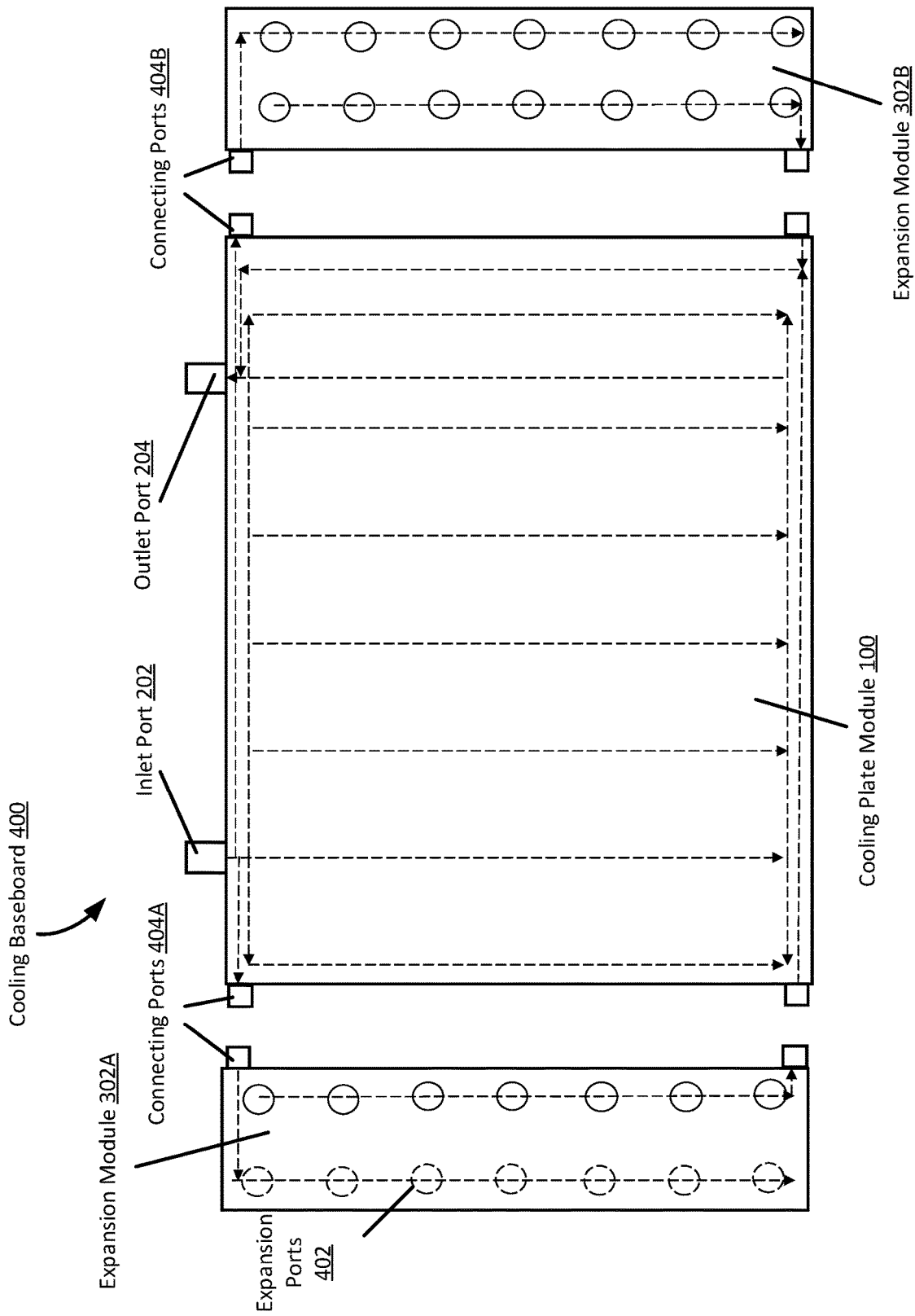
FIG. 4 shows a top view of a universal cooling baseboard module according to another embodiment.

FIG. 4 provides some additional internal fluid structural design of the cooling baseboard as well as a modularity concept of the cooling baseboard according to one embodiment. It can be seen that the cooling plate module and the expansion modules are presented in separate parts. They are connected using connecting ports, such as blind-mating connectors. This improves the flexibility for configuring the cooling baseboard for different server platforms. It needs to be mentioned that additional fluid expansion ports (both supply and return) are designed on the expansion module. Again, in terms of the fluid channel connecting any of the supply expansion ports on one of the expansion modules is identical as the other supply on either the same expansion module or a different expansion module. However, different type of expansion port connectors may be assembled on the expansion modules since different server loop may use different types or different sizes of connectors.

In one embodiment, referring to FIG. 4, a cooling baseboard 400 includes the cooling plate module 100 of FIG. 1 with an inlet port 202 and an outlet port 204. The cooling plate module 100 includes multiple connecting ports 404A-B used to connect expansion modules 302A-B to the cooling plate module. The expansion modules 302A-B includes a number of expansion ports 402 to connect cooling loops to the expansion modules 302A-B. Similar to FIG. 3, a circuit board can be attached to the surface of the cooling plate module 100. A cooling liquid flowing through the cooling plate module 100 extracts heat from the circuit board. The cooling plate module 100 receives the cooling liquid from an external cooling liquid source through inlet port 202.

The fluid expansion modules 302A-B may be modular components that can be attached to the cooling plate module using connecting ports 404A-B. The fluid expansion modules 302A-B may include one or more expansion ports 402 for providing a cooling liquid to additional cooling loops and cooling devices. The ports can be assembled with different type of connectors, such as dripless quick disconnects. The expansion ports module can be configured with different sizes of ports on it. The fluid expansion modules 302A-B can receive the cooling liquid from the cooling plate module 100 and provide the cooling liquid to additional cooling loops. Each expansion module 302A can include a liquid supply path and liquid return path. In one example, a cooling loop can be attached to both fluid expansion modules, such that one end of the loop is attached to the supply of one fluid expansion module 302A and the other end of the loop is attached to the return of the other fluid expansion module 302B. In another example, both ends of a cooling loop are attached to the supply and return of the same fluid expansion module. Once the cooling liquid traverses the fluid expansion modules 302A-B and any additional cooling loops attached to the fluid expansion modules 302A-B, the cooling liquid is returned to the cooling plate module 100.

The cooling liquid is then returned to the external liquid cooling source from the cooling plate module 100 through the outlet port 204.

Figure 5:
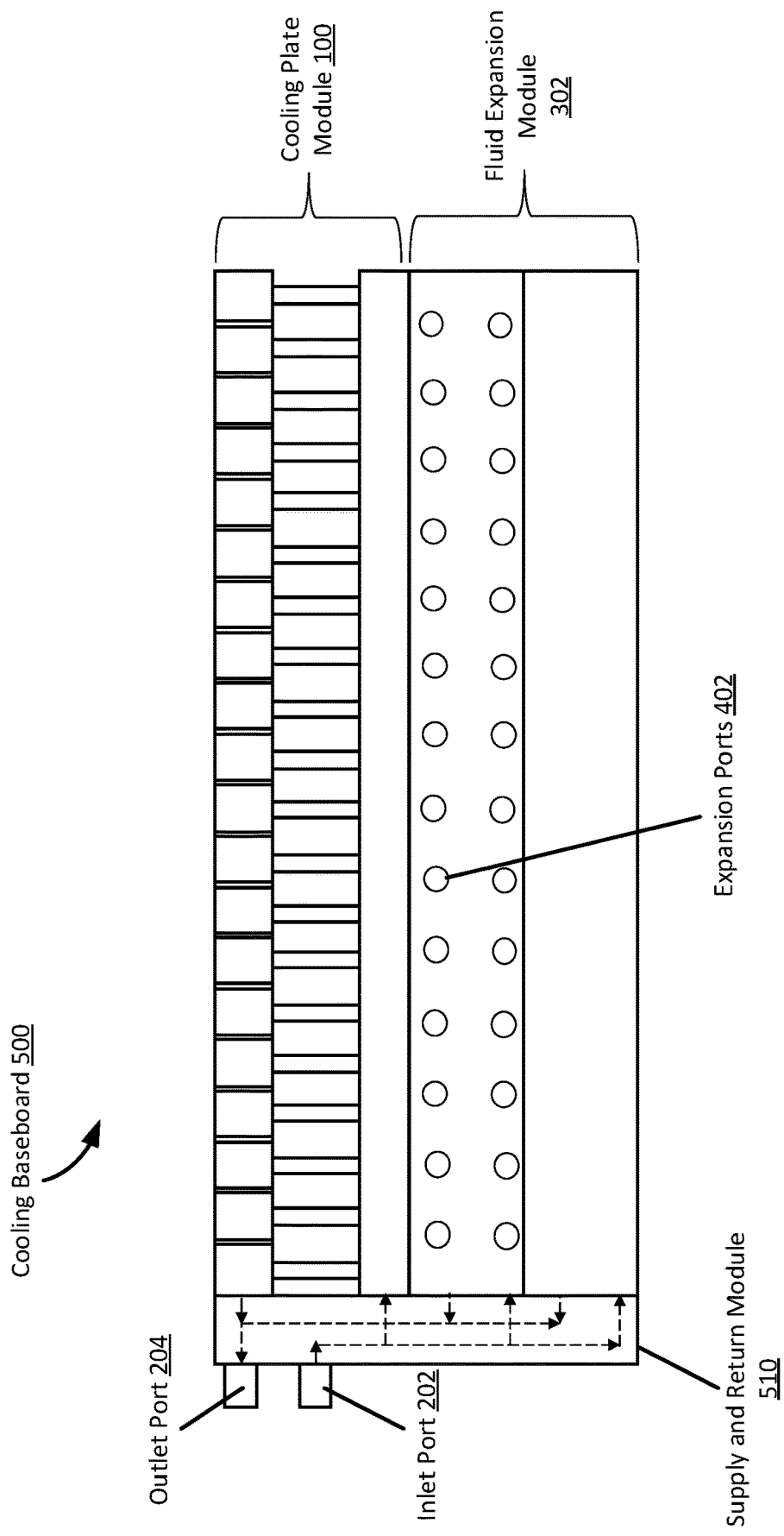
FIG. 5 shows a side view of a universal cooling baseboard module according to another embodiment.

FIG. 5 shows a side view of the cooling module design. The cooling baseboard can be arranged in multiple layers according to one embodiment. It can be shown that the cooling plate module is on the top and the fluid expansion module is at the bottom of the cooling plate module. In some applications, additional expansion modules can be added onto the cooling baseboard. These additional expansion modules will receive cooling fluid and return fluid through the same inlet and outlet port as the cooling plate module and fluid expansion module do.

In one embodiment, referring to FIG. 5, a cooling baseboard 500 includes a cooling plate module 100, a fluid expansion module 302, and a supply and return module 510. The fluid expansion module may 302 may be attached to the bottom side of the cooling plate module (i.e., the lower module 104 of FIG. 1). The supply and return module includes an inlet port 202 and an outlet port 204. The fluid expansion module 302 includes multiple expansion ports 402. The supply and return module 510 receives a cooling liquid from an external cooling liquid source through the inlet port 202. The supply and return module 510 directs the cooling liquid from the inlet port 202 to both the cooling plate module 100 and the fluid expansion module 302 in parallel. The supply and return module 510 also receives the cooling fluid that has flowed through the cooling plate module 100 and fluid expansion module 302 and returns it to the external cooling liquid source through the outlet port 204. The expansion ports 402 of the fluid expansion module 302 provide connections for additional liquid cooling loops.

Figure 6:
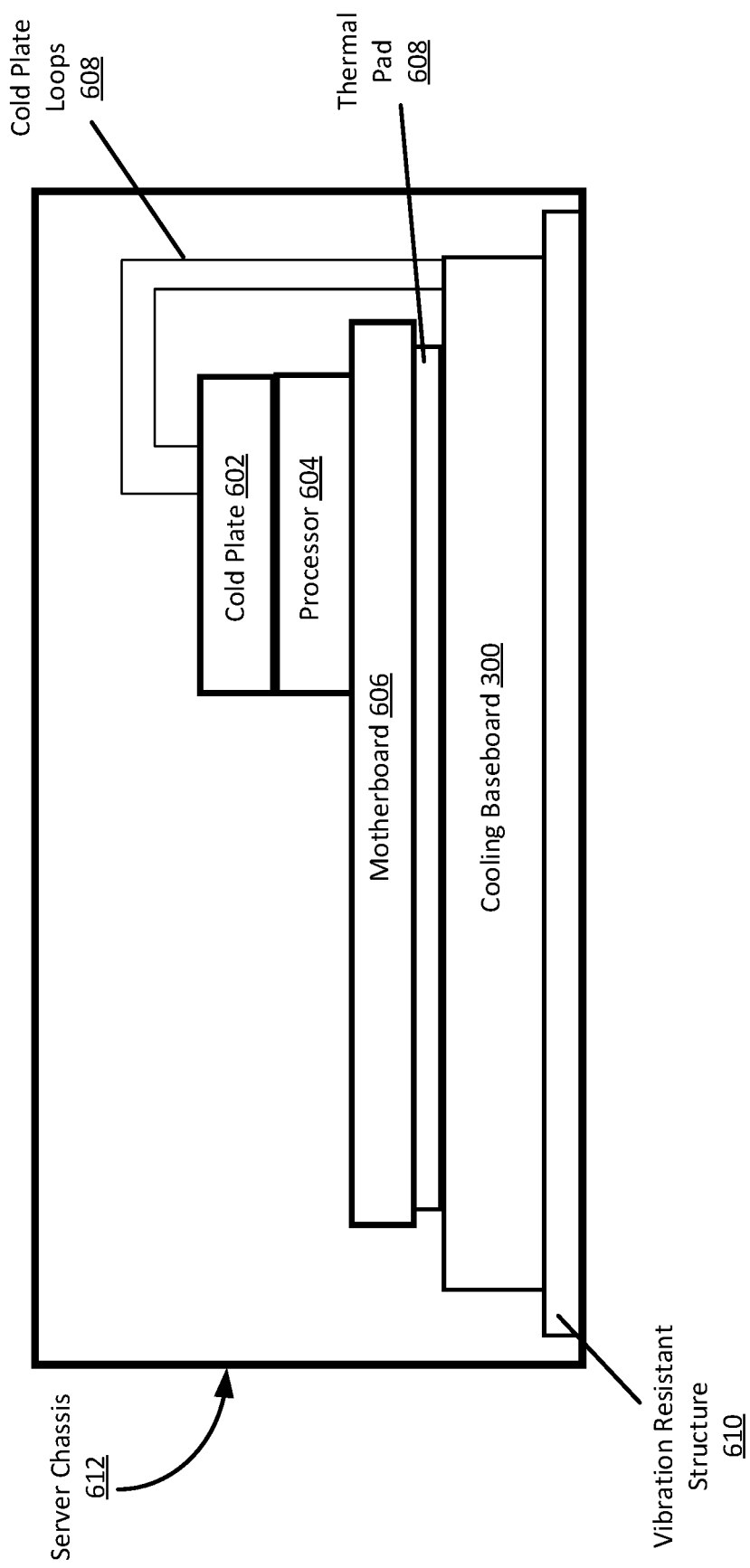
FIG. 6 shows a system using a universal cooling baseboard module according to another embodiment.

FIG. 6 shows an example when implementing the universal cooling baseboard module on a server chassis according to one embodiment. It can be seen that cooling baseboard is assembled at the bottom of the mother motherboard. The motherboard is attached onto the cooling baseboard thorough a thermal pad. The thermal pad provides a better connecting of the surfaces of the two items. At the bottom of the cooling baseboard, a vibration-resistant structure is used for enhancing the package reliability as well as the cooling baseboard reliability in shock vibration environment. The cooling baseboard is used to cool the bottom of the motherboard as well as the entire environment. Additional cooling devices such as a cold plate is used on the top of the GPU or CPU. Cold plate loops are then connected to the expansion modules on the cooling baseboard. The cooling baseboard provides a fundamental baseboard module that most of the cooling solution can be assembled based on it.

Note that the system as shown in FIG. 6 can represent any data processing system such as a planning and control system for an autonomous driving vehicle or an edge computing system. Alternatively, the system as shown in FIG. 6 may be one of the servers in an electronic rack of a data center, where the electronic rack includes an array of server blades. Each server blade includes one or more servers to provide data processing services to clients and each server may include one or more electronic devices (e.g., processors).

In one embodiment, referring to FIG. 6, a cooling baseboard 300 is included within a server chassis 612 to cool a motherboard 606 and electronics, such as a processor 604. The cooling baseboard 300 is attached to the server chassis 612 with a vibration resistant structure 610 located between the cooling baseboard 300 and the server chassis 612. The server chassis 612 may be located in an edge computing environment, such as an autonomous vehicle, requiring that the electronics be attached to the chassis in a manner to avoid damage due to vibration. The vibration resistant structure 610 protects the components attached to the server chassis 612 from movement that may cause damage to the components. The motherboard 606 is attached to the cooling baseboard 300. A thermal pad 608, which is thermally conductive, is placed between the cooling baseboard 300 and the motherboard 606. The thermal pad provides uniform contact and conductive heat transfer from the motherboard 606 to the cooling baseboard 300. The cooling baseboard 300 may include a cold plate on which the motherboard 606 is attached. The cold plate can include liquid distribution channel through which a cooling liquid flows to extract heat from the motherboard 606.

A processor 604 attached to the motherboard 606 can need additional cooling, such as when the processor 604 is a high performance processor with a high power density. A cold plate 602 is attached to the processor 604 to extract heat generated by the processor 604. The cold plate 602 may include a liquid distribution channel through which a cooling liquid flows to extract heat from the processor 604. Cold plate loops 608 couple the cold plate 602 to the cooling baseboard 300. The cooling baseboard 300 may provide the cooling liquid to the cold plate through the cold plate loops 608. For example, the cold plate loops 608 may be attached to a fluid expansion module (e.g., fluid expansion module 302A-B of FIG. 3) which includes connections for the cold plate loops 608 and provides cooling liquid to the additional cooling devices such as the cold plate 602.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling device for providing liquid cooling to an electronics circuit board, the cooling device comprising:
    an upper module having a cooling plate forming an upper surface to receive an external circuit board having one or more electronic devices deposited thereon, the upper module having a first liquid distribution channel embedded therein to extract heat from the electronic devices of the circuit board through the cooling plate using a cooling liquid flowing in the first liquid distribution channel;
    a lower module having a second liquid distribution channel embedded therein to receive the cooling liquid from an external cooling liquid source; and
    a plurality of tube channels positioned between the upper module and the lower module to receive the cooling liquid from the lower module and to supply the cooling liquid upwardly to the upper module.

2. The cooling device of claim 1, further comprising an expansion module coupled to the lower module, the expansion module having a liquid manifold comprised of one or more expansion port connections to provide liquid distribution to additional liquid cooling devices.

3. The cooling device of claim 2, wherein the additional liquid cooling devices comprise one or more cold plates attached to a top surface of the one or more electronic devices.

4. The cooling device of claim 3, wherein the expansion module is configured to supply a portion of the cooling liquid upwardly to the cold plates and to receive the supplied portion of the cooling liquid downwardly from the cold plates carrying heat exchanged from the one or more electronic devices.

5. The cooling device of claim 3, wherein the expansion module operates as a manifold having a plurality pairs of supply and return ports to be coupled to a plurality of cold plates using flexible tubing respectively.

6. The cooling device of claim 3, further comprising a main supply and return module coupled to the upper module, the lower module, and the expansion module, wherein the main supply and return module operates as a main manifold to the upper module, the lower module, and the expansion module.

7. The cooling device of claim 6, wherein the supply and return module comprises a pair of uplink liquid supply and return ports to be coupled to the external source and a plurality of pairs of downlink liquid supply and return ports coupled to the upper module, the lower module, and the expansion module.

8. The cooling device of claim 2, wherein the expansion module is detachably coupled to the lower module via one or more connecting ports using connectors.

9. The cooling device of claim 2, further comprising an additional cooling device coupled to one or more expansion ports of the liquid manifold of the expansion module, the additional cooling device to be positioned on one or more electronic components on a top surface of the circuit board.

10. The cooling device of claim 1, wherein the cooling plate further comprises a plurality of fins to provide additional contact area between the cooling liquid and the cooling plate to increase conductive surface for heat transfer.

11. The cooling device of claim 1, wherein the tube channels of the plurality of tube channels are positioned to allow air to flow in an air space between the cooling plate, the lower module, and the tube channels.

12. The cooling device of claim 1, further comprising:
an inlet port to receive cooling liquid from an external source; and
an outlet port to return the cooling liquid carrying the heat extracted from the circuit board back to the external source.

13. The cooling device of claim 1, further comprising a first thermal pad disposed between the cooling plate and the bottom surface of the circuit board, wherein the thermal pad is heat conductive.

14. A data processing system, comprising:
one or more electronic devices disposed on a circuit board, the one or more electronic devices including at least one processor; and
a cooling device, including
an upper module having a cooling plate forming an upper surface to receive the circuit board having the one or more electronic devices deposited thereon, the upper module having a first liquid distribution channel embedded therein to extract heat from the electronic devices of the circuit board through the cooling plate using a cooling liquid flowing in the first liquid distribution channel;
a lower module having a second liquid distribution channel embedded therein to receive the cooling liquid from an external cooling liquid source; and
a plurality of tube channels positioned between the upper module and the lower module to receive the cooling liquid from the lower module and to supply the cooling liquid upwardly to the upper module.

15. The data processing system of claim 14, wherein the cooling device further comprises an expansion module coupled to the lower module, the expansion module having a liquid manifold comprised of one or more expansion port connections to provide liquid distribution to additional liquid cooling devices.

16. The data processing system of claim 15, wherein the additional liquid cooling devices comprise one or more cold plates attached to a top surface of the one or more electronic devices.

17. The data processing system of claim 16, wherein the expansion module is configured to supply a portion of the cooling liquid upwardly to the cold plates and to receive the supplied portion of the cooling liquid downwardly from the cold plates carrying heat exchanged from the one or more electronic devices.

18. An electronic rack of a data center, comprising:
a plurality of server blades arranged in a stack, each server blade having one or more servers to provide data processing services to a client, wherein each server comprises:
one or more electronic devices disposed on a circuit board, the one or more electronic devices including at least one processor; and
a cooling device, including
an upper module having a cooling plate forming an upper surface to receive the circuit board having the one or more electronic devices deposited thereon, the upper module having a first liquid distribution channel embedded therein to extract heat from the electronic devices of the circuit board through the cooling plate using a cooling liquid flowing in the first liquid distribution channel;
a lower module having a second liquid distribution channel embedded therein to receive the cooling liquid from an external cooling liquid source; and
a plurality of tube channels positioned between the upper module and the lower module to receive the cooling liquid from the lower module and to supply the cooling liquid upwardly to the upper module.

19. The electronic rack of claim 18, wherein the cooling device further comprises an expansion module coupled to the lower module, the expansion module having a liquid manifold comprised of one or more expansion port connections to provide liquid distribution to additional liquid cooling devices.

20. The electronic rack of claim 18, wherein the additional liquid cooling devices comprise one or more cold plates attached to a top surface of the one or more electronic devices.

* * * * *